(12) United States Patent
Mikhemar et al.

(10) Patent No.: US 9,154,289 B2
(45) Date of Patent: Oct. 6, 2015

(54) ELECTRICAL BALANCE DUPLEXER FOR CO-EXISTENCE AND CONCURRENT OPERATION OF MORE THAN ONE WIRELESS TRANSCEIVERS

(71) Applicant: BROADCOM CORPORATION, Irvine, CA (US)

(72) Inventors: Mohyee Mikhemar, Aliso Viejo, CA (US); Hooman Darabi, Laguna Niguel, CA (US)

(73) Assignee: BROADCOM CORPORATION, Irvine, CA (US)

( * ) Notice: Subject to any disclaimer, the term of this patent is extended or adjusted under 35 U.S.C. 154(b) by 401 days.

(21) Appl. No.: 13/688,053

(22) Filed: Nov. 28, 2012

(65) Prior Publication Data

US 2014/0146718 A1    May 29, 2014

(51) Int. Cl.
*H04B 1/44* (2006.01)
*H04L 5/14* (2006.01)
*H04B 1/52* (2015.01)
*H03H 7/46* (2006.01)

(52) U.S. Cl.
CPC .. *H04L 5/14* (2013.01); *H04B 1/52* (2013.01); *H03H 7/463* (2013.01)

(58) Field of Classification Search
CPC ............ H04B 1/44; H04B 1/52; H04B 1/525; H04L 5/14; H03H 7/463; H03H 2250/00; H03H 7/09

USPC ............. 333/126, 129, 132, 1.1, 4, 5, 25, 131
See application file for complete search history.

(56) References Cited

U.S. PATENT DOCUMENTS

| | | | |
|---|---|---|---|
| 3,781,684 A * | 12/1973 | Inslerman | 455/11.1 |
| 6,721,544 B1* | 4/2004 | Franca-Neto | 455/83 |
| 8,208,866 B2* | 6/2012 | Mikhemar et al. | 455/77 |
| 8,279,018 B1* | 10/2012 | Song et al. | 333/25 |
| 8,792,836 B2* | 7/2014 | Mikhemar et al. | 455/78 |
| 8,971,219 B2* | 3/2015 | Choksi | 370/276 |
| 2014/0306780 A1* | 10/2014 | Lehtinen | 333/131 |

* cited by examiner

*Primary Examiner* — Dean Takaoka
*Assistant Examiner* — Alan Wong
(74) *Attorney, Agent, or Firm* — McDermott Will & Emery LLP

(57) ABSTRACT

A circuit for a common electrical balance duplexer (EBD) of a multi-path transceiver may include an EBD circuit. The EBD circuit may be coupled to output nodes of two or more transmit (TX) paths, one or more antennas, and input nodes of two or more receive (RX) paths. The EBD circuit may be configured to isolate the TX paths from the RX paths, and to provide low-loss signal paths between the output nodes of the transmit (TX) paths and one or more antennas. One or more balancing networks may be coupled to the EBD circuit to provide one or more impedances, each matching a corresponding impedance associated with one of the antennas. The output nodes of the transmit (TX) paths may include output nodes of a first and a second power amplifier (PA). The first and the second PA may share a matching transformer that is merged with the EBD circuit.

20 Claims, 4 Drawing Sheets

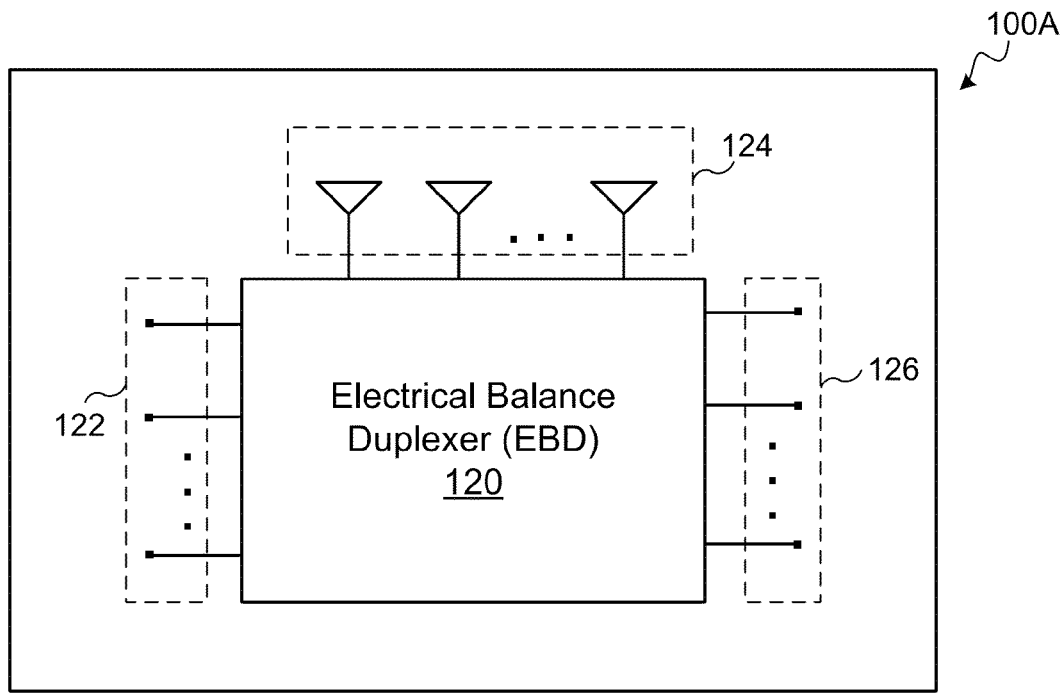
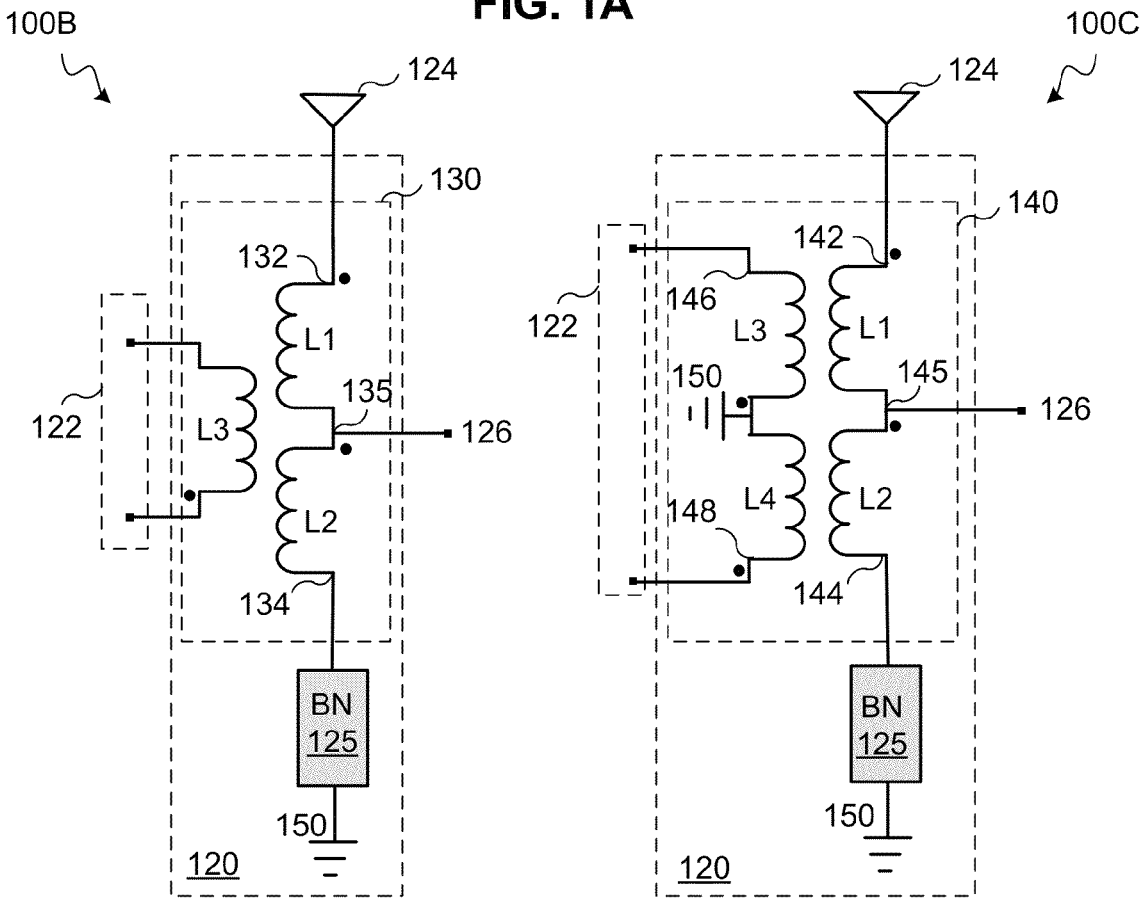
FIG. 1A
FIG. 1B
FIG. 1C

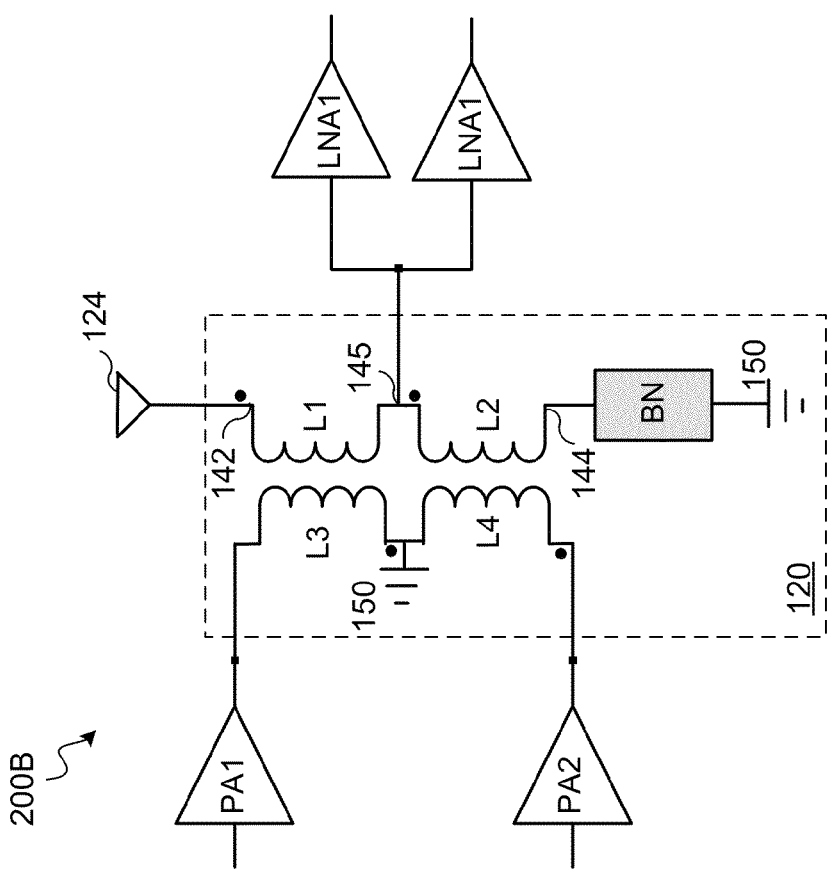
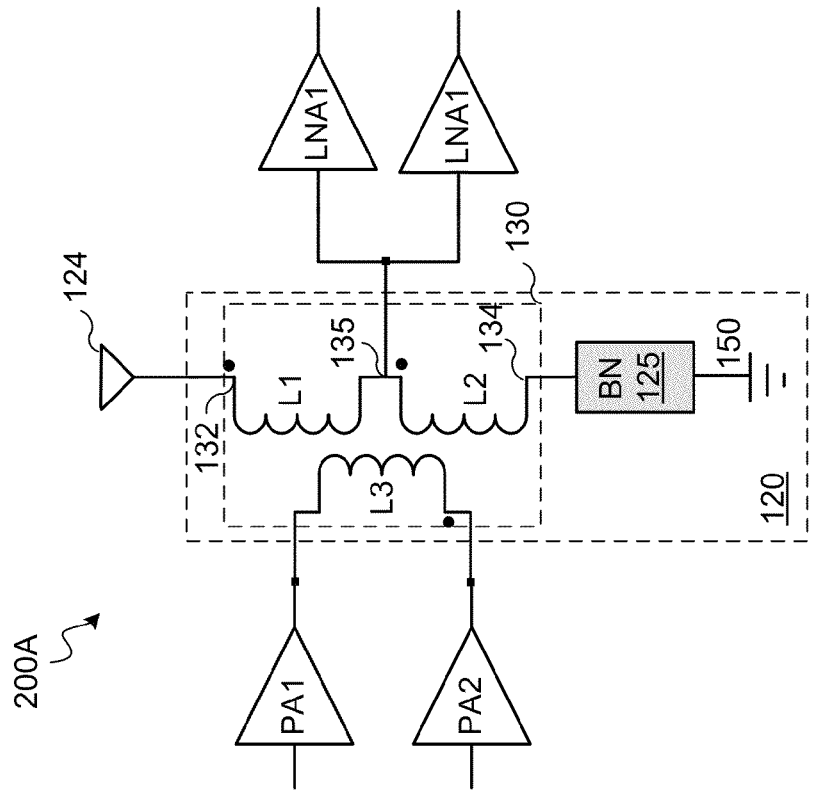
FIG. 2B
FIG. 2A

US 9,154,289 B2

ELECTRICAL BALANCE DUPLEXER FOR CO-EXISTENCE AND CONCURRENT OPERATION OF MORE THAN ONE WIRELESS TRANSCEIVERS

TECHNICAL FIELD

The present description relates generally to radio frequency (RF) communications, and more particularly, but not exclusively, to an electrical balance duplexer for co-existence and concurrent operation of more than one wireless transceivers.

BACKGROUND

Many commercial cellular handsets require multi-band operation. Typically, a 2G/3G cellular transceiver may cover a number of 2G frequency bands (e.g., 850, 900, 1800, and 1900 MHz) and several 3G frequency bands (e.g., bands I, II, III). The existing multi-band approach may be inefficient in terms of cost and area. The limitation of such multi-band approach may stem from the need for highly selective radio-frequency (RF) filters, such as SAW filters for 2G and duplexers for 3G operation. With the introduction of new technologies such as 4G and multiple antennas, and the demand to cover more frequency bands, the number of required RF filters and duplexers may increase to an impractical level, in terms of cost and area.

An optimal implementation of a multi-band transceiver may include an antenna-ready radio, completely integrated on a single CMOS chip. One of the missing pieces to realize the single CMOS chip antenna-ready radio is a wideband multi-band RF duplexer, for example, a wideband integrated RF duplexer supporting 3G/4G (e.g., supporting bands, such as bands I, II, III, IV, and IX). The RF duplexer may provide isolation in transmit (TX) band to avoid saturation of the receiver, and also to relax the linearity and phase noise requirement of the receive (RX) path. The wideband multi-band transceiver may include more than one TX and RX paths that are coexisting on the same chip and may be required to operate concurrently.

Therefore, the need exists for an RF duplexer circuit for coexistence and concurrent operation of more than one wireless transceivers.

BRIEF DESCRIPTION OF THE DRAWINGS

Certain features of the subject technology are set forth in the appended claims. However, for purpose of explanation, several embodiments of the subject technology are set forth in the following figures.

FIG. 1A illustrates an example multi-path RF transceiver using a common electrical balance duplexer (EBD) in accordance with one or more implementations.

FIG. 1B illustrates an example implementation of the common EBD of the RF transceiver of FIG. 1A in accordance with one or more implementations.

FIG. 1C illustrates another example implementation of the common EBD of the RF transceiver of FIG. 1A in accordance with one or more implementations.

FIG. 2A illustrates an example implementation of a dual-path transceiver using the EBD of FIG. 2B in accordance with one or more implementations.

FIG. 2B illustrates an example implementation of a dual-path transceiver using the EBD of FIG. 1C in accordance with one or more implementations.

DETAILED DESCRIPTION

Figure 2C:
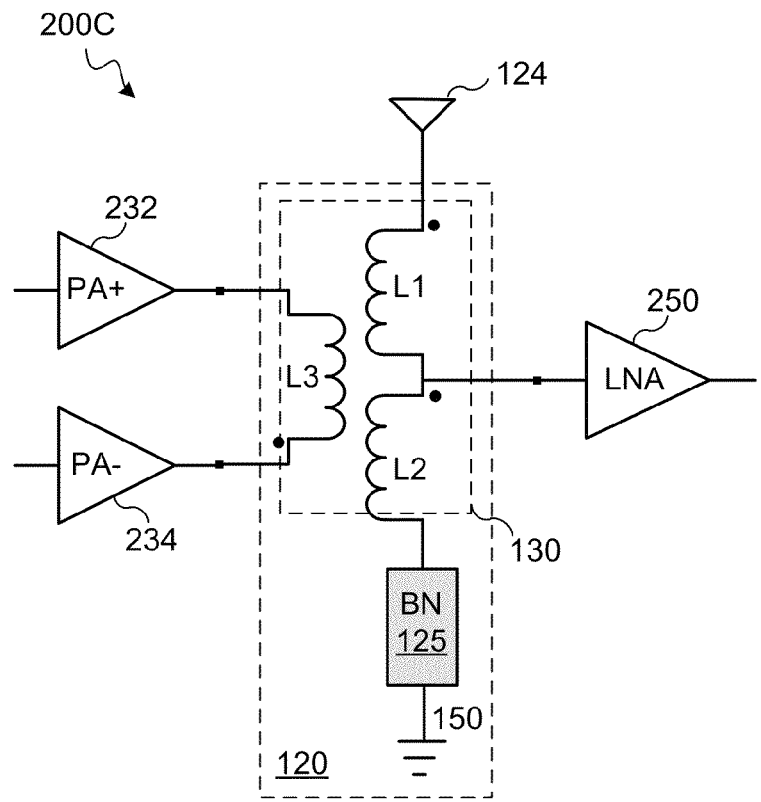
FIG. 2C illustrates an example application of the EBD of FIG. 1B in a differential transmit (TX) path transceiver in accordance with one or more implementations.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

FIG. 1A illustrates an example multi-path RF transceiver 100A using a common electrical balance duplexer (EBD) 120 in accordance with one or more implementations of the present invention. The multi-path RF transceiver 100A may include a number of (e.g., two or more) transmit (TX) paths and a corresponding number of (e.g., two or more) receive (RX) paths that share a common duplexer (e.g., the EBD 120) to couple to one or more antennas 124. The common EBD 120 may facilitate concurrent operation of the TX and RX paths. The common EBD 120 may be coupled to output nodes 122 of the TX paths and the input nodes 126 of the RX paths, and may provide a low-loss signal path between an output node of the output nodes 122 of the TX paths (hereinafter "output node 122") and a corresponding input node of the input nodes 126 of the RX paths (hereinafter "input node 126").

In RF transceivers, the role of the duplexer is to provide a specific isolation (e.g., 50 dB for 3G applications) in TX band to avoid saturation of the receiver or damaging the LNA, and also to relax the linearity and phase noise requirement of the RX path. Furthermore, the RF duplexer may attenuate the noise in the RX band by approximately 45 dB to push the RX-band noise below the RX noise floor. The conventional duplexers are implemented as two very sharp RF SAW filters. Typical insertion loss of the RF SAW duplexers, for the TX and RX path, may be approximately 2 dB and 2.5 dB, respectively. The SAW filters, however, cannot be integrated on a silicon-based chip. Further, a SAW filter typically has a narrow bandwidth. As a result, a conventional duplexer operating in multiple frequency bands may require multiple SAW filters (e.g., one for each frequency band), increasing the size and the cost of the RF board. The EBD 120 provides a low cost small area solution by facilitating integration of the TX and RX paths of the multiband transceiver 100A on a single chip (e.g., CMOS chip).

FIG. 1B illustrates an example implementation 100B of the EBD 120 of the RF transceiver 100A of FIG. 1A in accordance with one or more implementations of the present invention. The implementation 100B may represent a dual-path RF transceiver (e.g., an RF transceiver with two RX paths and two TX paths that are coexistence on a chip and concurrently operational). In some aspects of the present invention, the dual-path RF transceiver may include a dual-path wireless transceiver (e.g., a Wi-Fi and Bluetooth enabled transceiver), for which the frequency bands of the RX and TX paths may allow sharing a single antenna. The EBD 120 may include an EBD circuit 130 and a balancing network 125. The EBD circuit 130 may be implemented using a hybrid auto-transformer including an inductor L3 magnetically coupled to an auto-transformer formed by inductors L1 and L2.

The antenna 124 may be coupled to the first node 132 of the auto-transformer. The balancing network 125 may be connected between node 134 of the auto-transformer and ground potential 150. The middle node 135 of the auto-transformer may be coupled to one or more inputs 126 of the RX paths of the dual-path RF transceiver. The inductor L3 of the hybrid auto-transformer may function as a transformer that can couple output nodes 122 of the TX paths of the dual-path RF transceiver. The balancing network 125 may be configured to provide an impedance that can match a corresponding impedance associated with the antenna 124. Therefore, the currents induced in the inductors L1 and L2 by each TX signal (e.g., TX voltage signal) at each of the output nodes 122 of the TX paths may generate voltage signals with substantially equal amplitudes at the nodes 132 and 134 of the EBD circuit 130. Consequently, the voltage signal at the node 126 of the EBD circuit 130, resulting from the TX signals at the output nodes 122, may be substantially zero. Thus, the EBD circuit 130 can provide a significantly high isolation between the input nodes 122 of the TX paths and the output nodes 126 of the RX path of the dual-path RF transceiver. The signal path between the output nodes 122 of the TX paths and the antenna 124 may be a low-loss signal path. This is because the current induced in the inductors L1 and L2 by TX signals at the output nodes 122 of the TX paths are directly provided to the antenna 124.

FIG. 1C illustrates another example implementation 100C of the EBD 120 of the RF transceiver 100A of FIG. 1A in accordance with one or more implementations of the present invention. The implementation 100C may represent a dual-path RF transceiver (e.g., a dual-path wireless transceiver (e.g., a Wi-Fi and Bluetooth enabled transceiver), for which the frequency bands of the RX and TX paths may allow sharing a single antenna. The implementation 100C is similar to the implementation 100B of FIG. 1B, except for coupling of the input nodes 122 of the TX paths to the auto-transformer (e.g., formed by inductors L1 and L2), which in the implementation 100B, is performed by two inductors L3 and L4. The inductors L3 and L4 may share a common node that is connected to ground potential 150. The other nodes 146 and 148 of the inductors L3 and L4 are connected to the output nodes 122 of the TX path. As explained herein, the configuration of the inductors L1, L2, L3, and L4 is such that the output nodes 122 of the TX paths are substantially isolated from the input node 126 of the RX paths.

The inductors L1, L2, L3, and L4 are configured (e.g., by shared ground potential 150 and the direction of windings as denoted by dots) such that the TX voltage signal at each of the output nodes 122 of the TX paths may generate a TX current signal in one of the inductors L3 or L4 which is directly connected to that node. However, the TX current signal generated in any of the inductors L3 or L4 can induce substantially the same currents in inductors L1 and L2, such that no current resulting from the TX voltage signal (at one of output nodes 122 of the TX paths) can enter the input node 126 of the RX path. The same current signal also passes through the antenna 124 and the balancing network 125, and since the impedance of the balancing network 125 is matched with the impedance of the antenna 124, the voltage signals at nodes 142 and 144 may have substantially equal amplitudes. This may force the signal voltage at node 145 (resulting from the TX voltage signal at one of output nodes 122 of the TX paths) to near ground potential (e.g., zero). Therefore, the input node 126 of the RX paths is substantially isolated from the output nodes 122 of the TX paths. Further, the signal path between the output nodes 122 of the TX paths and the antenna 124 may be a low-loss signal path. This is because the current induced in the inductors L1 and L2 by the TX signals at the output nodes 122 of the TX paths are directly provided to the antenna 124.

FIG. 2A illustrates an example implementation of a dual-path transceiver 200A using the EBD 120 of FIG. 1B in accordance with one or more implementations of the present invention. In the dual-path transceiver 200A, the EBD 120, as in FIG. 1B, includes an EBD circuit 130 and a balancing network 125 coupling the EBD circuit 130 to ground potential 150. Output nodes of two power amplifier (PAs) PA1 and PA2 of the two TX paths are arranged to share a matching transformer that is merged with the EBD circuit 130. In other words, the windings of the auto-transformer of EBD circuit 130 may replace the secondary winding of the shared matching transformer. This may facilitate the integration of the dual-path receiver on a single chip, which allows saving cost and area. The shared matching transformer is formed by the inductor L3 that is magnetically coupled to inductors L1 and L2 of the EBD circuit 130. The input nodes of two low-noise amplifiers (LNAs) LNA1 and LNA2, connected to the node 135 of the auto-transformer of the EBD circuit 130 may be substantially isolated from the output nodes of the PA1 and PA1. For example, an output voltage signal of PA1 may induce equal signal currents in inductors L1 and L2. For instance, if the direction of flow of the induced signal current in the inductor L1 is from the node 135 to the node 132, the direction of flow of the induced signal current in the inductor L2 is from the node 134 to the node 135 (e.g., both currents have the same direction). Similar explanation can be applied to induced current signals resulting from an output voltage signal of PA2. Therefore, no induced current signal, resulting from an output voltage signal of PA1 or PA2, can flow into the input nodes of the LNA1 and LNA2. Further, the signal paths between the output nodes of the PA1 and PA2 and the antenna 124, may be low-loss signal paths. This is because the current induced in the inductors L1 and L2 by the TX signals at the output nodes of the PA1 and PA2 are directly provided to the antenna 124.

FIG. 2B illustrates an example implementation of a dual-path transceiver 200B using the EBD 120 of FIG. 1C in accordance with one or more implementations of the present invention. The dual transceiver 200B is similar to the dual transceiver 200A of FIG. 2A, except that the shared matching transformer of the two power amplifiers PA1 and PA2 may include two primary windings (e.g., inductors L3 and L4) that share a common ground 150. In the dual transceiver 200B, the EBD 120 includes the EBD 140 of FIG. 1C and the balancing network 125. The EBD 120 may substantially isolate the output nodes of the PA1 and PA2 from the input nodes of the LNA1 and LNA2. For example, an output voltage signal of PA2 may generate a TX current signal in the inductor L4 which can in turn induce equal signal currents in inductors L1 and L2. For instance, if the direction of flow of the induced signal current in L1 is from node 142 to node 145, the direction of flow of the induced signal current in L2 is from node 145 to node 144 (e.g., both currents have the same direction). Similar explanation can be applied to induced current signals resulting from an output voltage signal of PA1. Therefore, no induced current signal, resulting from an output voltage signal of PA1 or PA2, can flow into the input nodes of the LNA1 and LNA2. Further, the signal path between the output nodes of the PA1 and PA2 and the antenna 124, may be low-loss signal paths. This is because the current induced in the inductors L1 and L2 by the TX signals at the output nodes of the PA1 and PA2 are directly provided to the antenna 124.

FIG. 2C illustrates an example application of the EBD 120 of FIG. 1B in a differential TX path transceiver 200C in accordance with one or more of the present invention. The differential TX path transceiver 100C may use the EBD 120 of FIG. 1B to couple output nodes of a differential TX path to an antenna 124. The output nodes of the differential TX path may include output nodes of two power amplifiers 232 and 234. The PA 232 may provide the positive TX voltage signal and the PA 234 may provide the negative TX voltage signal. The EBD 120 includes an EBD circuit 130 including an auto-transformer formed by inductors L1 and L2 and a balancing network 125 coupling the EBD circuit 130 to ground potential 150. Conventionally, the differential PAs may use one or more matching transformers. The EBD 120 advantageously allows merging of the matching transformer of the differential PAs (e.g., 232 and 234) with the auto-transformer of the EBD circuit 130. As discussed with respect to FIGS. 1B and 2A, the EBD 120 provides a low-loss path between output nodes of the PAs 232 and 234 and the antenna 124. The EBD 120 may substantially isolate the output nodes of the PAs 232 and 234 and the input node of the LNA 250.

Figure 2D:
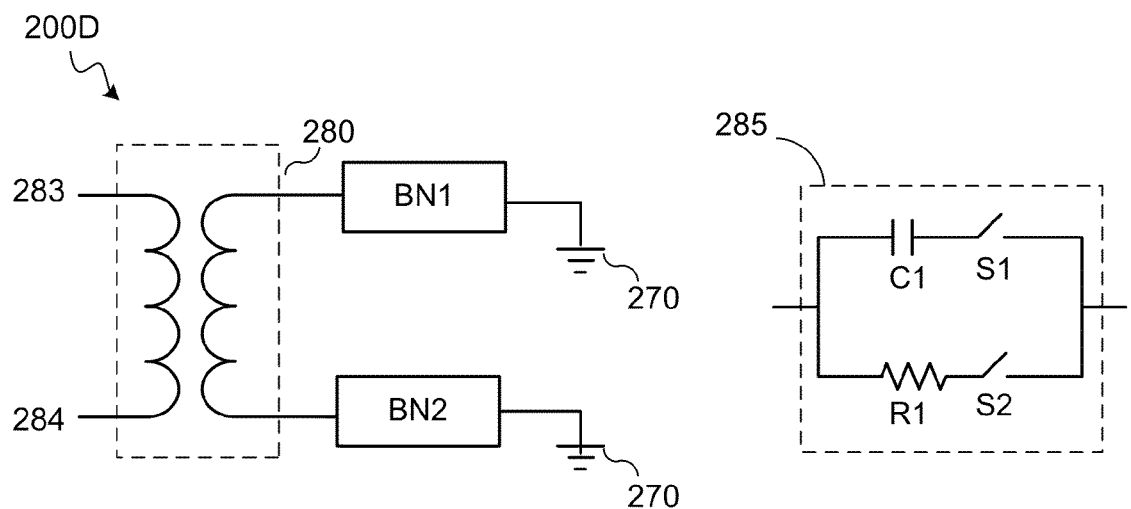
FIG. 2D illustrates an example balancing network for coupling to the EBDs of FIGS. 1B and 1C in accordance with one or more implementations.

FIG. 2D illustrates an example balancing network for coupling to the EBD circuits 130 and 140 of FIGS. 1B and 1C, respectively, in accordance with one or more implementations of the present invention. The balancing network 200D includes impedance blocks BN1 and BN2 that can be coupled to the EBD circuits 130 and 140 via a transformer 280, where the nodes 283 and 284 of a secondary winding of the transformer 280 may be connected, respectively, to the node 134 and ground potential 150 (of FIG. 1B) or the node 144 and ground potential 150 (of FIG. 1C). In one or more implementations, the balancing network 200D may include more than two impedance blocks. Each impedance block (e.g., 285) may include a number of parallel branches (e.g., two branches), where each branch may include a passive element (e.g., a resistor, such as R1 or a capacitor, such as C1), each coupled to ground potential (e.g., 270, which may be the same as ground potential 150) through a switch (e.g., switches S1 or S2, such as MOS switches). The equivalent impedance Z3 of the balancing network 200D, seen through nodes 283 and 284 of the transformer 280 may depend on the impedances of the impedance block (e.g., BN1 and BN2) and a turn ratio of the transformer 280. The switches S1 and S2 may be controlled via control signals that may adjust the impedance Z3 by adding or removing one or more of the passive elements of the impedance blocks.

Figure 3:
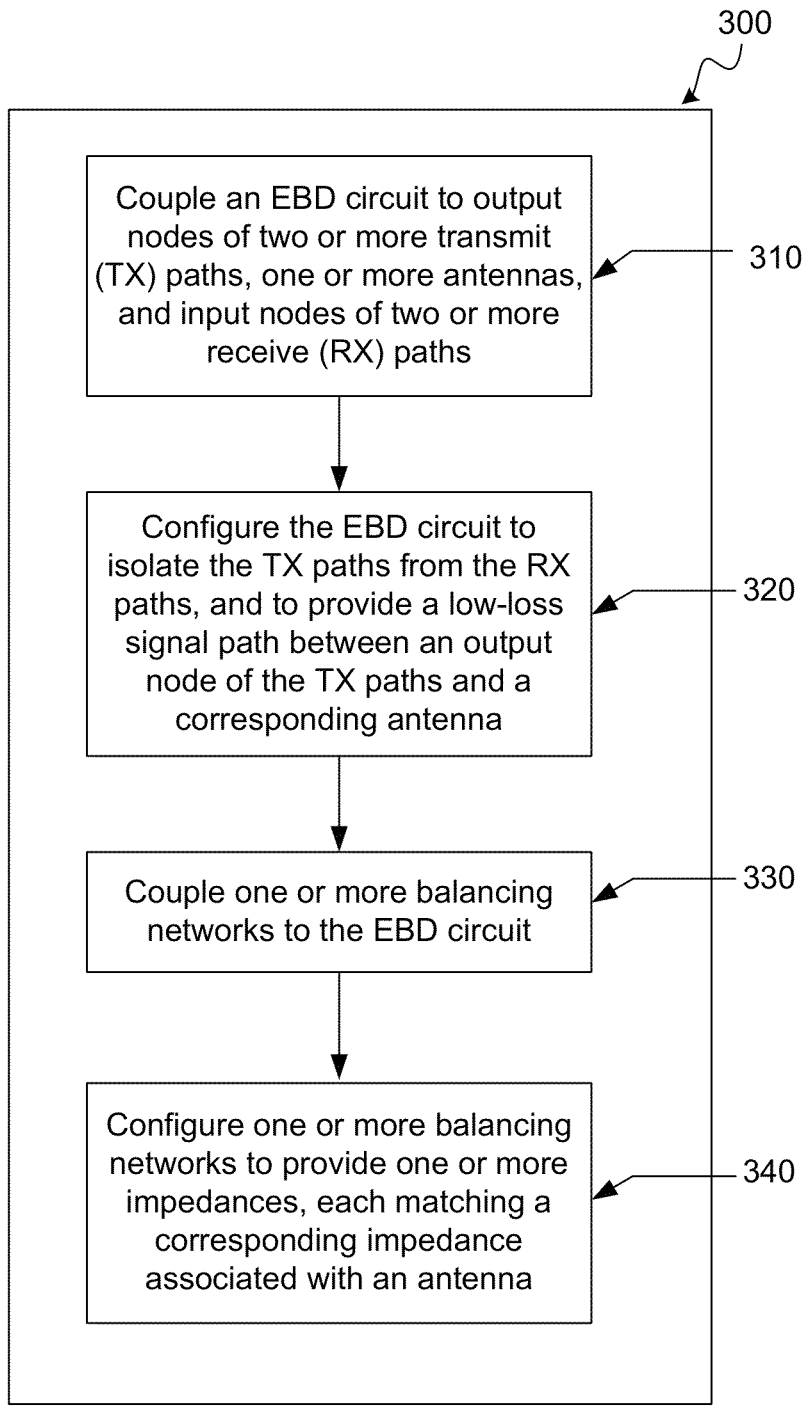
FIG. 3 illustrates an example method for providing a common EBD of a multi-path transceiver in accordance with one or more implementations.

FIG. 3 illustrates an example method 300 for providing a common EBD of a multi-path transceiver in accordance with one or more implementations of the present invention. For explanatory purposes, the example method 300 is described herein with reference to the multi-path transceiver 100A of FIG. 1A and EBD 120 of FIGS. 1B and 1C; however, the example method 300 is not limited to the multi-path transceiver 100A and EBD 120. Further, for explanatory purposes, the blocks of the example method 300 are described herein as occurring in serial, or linearly. However, multiple blocks of the example method 300 may occur in parallel. In addition, the blocks of the example method 300 need not be performed in the order shown and/or one or more of the blocks of the example method 300 need not be performed.

At operation block 310, an EBD circuit (e.g., 130 of FIG. 1B and 140 of FIG. 1C) may be coupled to output nodes (e.g., 122 of FIGS. 1A, 1B, and 1C) of tow or more TX paths, one or more antennas (e.g., 124 of FIGS. 1A, 1B, and 1C), and input nodes (e.g., 126 of FIGS. 1A, 1B, and 1C) of two or more receive (RX) paths. The EBD circuit, at operation block 320, may be configured to isolate the two or more TX paths from the two or more RX paths, and to provide low-loss signal paths between the output nodes of the two or more transmit (TX) paths and the one or more antennas.

At operation block 330, one or more balancing networks (e.g., 125 of FIGS. 1B and 1C) may be coupled to the EBD circuit. Each balancing network may be configured to provide an impedance that matches a corresponding impedance associated with one of the antennas (operation block 340).

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit for a common electrical balance duplexer (EBD) of a multi-path transceiver, the circuit comprising:
    an EBD circuit coupled to output nodes of at least two transmit (TX) paths, at least one antenna, and input nodes of at least two receive (RX) paths, the EBD circuit being configured to isolate the at least two TX paths from the at least two RX paths, and to provide a low-loss signal path between an output node of the at least two TX path and a corresponding antenna of the at least one antenna; and
    at least one balancing network coupled to the EBD circuit and configured to provide at least one impedance, each of the at least one impedances to match a corresponding one of one or more impedances associated with the at least one antenna,
    wherein, the output nodes of the at least two TX paths comprise output nodes of a differential TX path comprising output nodes of a first and a second power amplifier (PA), and wherein the first and the second PA are arranged to share a matching transformer that is merged with the EBD circuit.

2. The circuit of claim 1, wherein the EBD circuit is configured to allow concurrent operation of the at least two TX and RX paths.

3. The circuit of claim 1, wherein the at least two TX and RX paths are associated with a wireless multi-path transceiver, and wherein the wireless multi-path transceiver is configured to utilize a shared antenna.

4. The circuit of claim 3, wherein the EBD circuit comprises an auto-transformer, and wherein the auto-transformer comprises a first and a second node and a middle node.

5. The circuit of claim 4, wherein:
    the shared antenna and at least one of the balancing networks are, respectively, coupled to the first and the second nodes of the auto-transformer, and
    the middle node of the auto-transformer is coupled to the at least one RX path, and
    a primary winding of the shared matching transformer is magnetically coupled to the auto-transformer of the EBD circuit.

6. The circuit of claim 1, wherein the shared matching transformer comprises two primary windings sharing a second node coupled to ground potential, and wherein each of the first and the second PA are coupled to a respective first node of one of the two primary windings.

7. The circuit of claim 1, wherein the input nodes of the at least two receive (RX) paths comprise one or more input nodes of a low noise amplifier (LNA).

8. The circuit of claim 1, wherein the EBD circuit is configured to substantially reduce a noise generated by the one or more impedances associated with the at least one antenna, at the input nodes of the at least two receive (RX) paths.

9. The circuit of claim 1, wherein the EBD circuit is configured to be integrated with the at least two TX and RX paths on a single chip, and wherein the single chip comprises a silicon CMOS chip.

10. A circuit for an electrical balance duplexer (EBD) with differential transmit (TX) path inputs, the circuit comprising:
    an EBD circuit coupled to output nodes of a differential TX path, an antenna, and one or more input nodes of a receive (RX) path, the EBD circuit being configured to isolate the differential TX path from the RX path, and to provide low-loss paths between the output nodes of the differential TX path and the antenna; and
    a balancing network coupled to the EBD circuit and configured to provide an impedance that matches an impedance associated with the antenna,
    wherein, the output nodes of the differential TX paths comprise output nodes of a first and a second power amplifier (PA), and wherein the first and the second PA are arranged to share a matching transformer that is merged with the EBD circuit.

11. The circuit of claim 10, wherein:
    the EBD circuit is configured to allow concurrent operation of the at least two TX and RX paths,
    the EBD circuit comprises an auto-transformer, and wherein the auto-transformer comprises a first and a second node and a middle node,
    the one or more input nodes of a receive (RX) path comprise one or more input nodes of a low noise amplifier (LNA), and
    the EBD circuit is configured to be integrated with the differential TX path and the RX path on a single chip, and wherein the single chip comprises a silicon CMOS chip.

12. A method of providing a common electrical balance duplexer (EBD) of a multi-path transceiver, the method comprising:
    coupling an EBD circuit to output nodes of at least two transmit (TX) paths, at least one antenna, and input nodes of at least two receive (RX) paths, and configuring the EBD circuit to isolate the at least two TX paths from the at least two RX paths, and to provide low-loss loss paths between the output nodes of the at least two transmit (TX) paths and the at least one antenna; and
    coupling at least one balancing network to the EBD circuit, and configuring the at least one balancing network to provide at least one impedance, each of the at least one impedances to match a corresponding one of one or more impedances associated with the at least one antenna, wherein, the output nodes of the at least two transmit (TX) path comprise output nodes of a differential TX path comprising output nodes of a first and a second power amplifier (PA), and wherein the first and the second PA are arranged to share a matching transformer that is merged with the EBD circuit.

13. The method of claim 12, further comprising configuring the EBD circuit to allow concurrent operation of the at least two TX and RX paths.

14. The method of claim 12, wherein the at least two TX and RX paths are associated with a wireless multi-path transceiver, and the method further comprising configuring the wireless multi-path transceiver to utilize a shared antenna.

15. The method of claim 12, wherein the EBD circuit comprises an auto-transformer, and wherein the auto-transformer comprises a first and a second node and a middle node.

16. The method of claim 15, further comprising:
coupling the shared antenna and at least one of the balancing networks, respectively, to the first and the second nodes of the auto-transformer, and
coupling the middle node of the auto-transformer to the at least one RX path, and
magnetically coupling a primary winding of the shared matching transformer to the auto-transformer of the EBD circuit.

17. The method of claim 16, wherein the shared matching transformer comprises two primary windings sharing a second node coupled to ground potential, and the method further comprising coupling each of the first and the second PA to a respective first node of one of the two primary windings.

18. The method of claim 12, further comprising integrating the EBD circuit with the at least two TX and RX paths on a single chip, and wherein the single chip comprises a silicon CMOS chip.

19. The method of claim 12, further comprising configuring the EBD circuit to substantially reduce a noise generated by the one or more impedances associated with the at least one antenna, at the input nodes of the at least two receive (RX) paths.

20. The method of claim 12, wherein coupling the EBD circuit to the input nodes of the at least two receive (RX) paths comprise coupling the EBD circuit to one or more input nodes of a low noise amplifier (LNA).

* * * * *